United States Patent [19]

Arntz

[11] Patent Number: 5,291,156
[45] Date of Patent: Mar. 1, 1994

[54] METHOD AND APPARATUS FOR IMPARTING POSITIVE PHASE SLOPE TO A NARROWBAND SIGNAL

[75] Inventor: Bernard J. Arntz, Morris, N.J.
[73] Assignee: AT&T Bell Laboratories, Murray Hill, N.J.
[21] Appl. No.: 15,732
[22] Filed: Feb. 10, 1993
[51] Int. Cl.$^5$ .............................................. H04B 3/04
[52] U.S. Cl. ...................................... 333/20; 333/156; 307/263
[58] Field of Search ........................... 333/20; 307/263

[56] References Cited

U.S. PATENT DOCUMENTS 4,354,168 10/1982 Fay ........................................ 333/156
4,491,808 1/1985 Saito .

Primary Examiner—Robert J. Pascal
Assistant Examiner—Darius Gambino
Attorney, Agent, or Firm—Jason P. DeMont

[57] ABSTRACT

A method and apparatus for imparting a positive phase slope (i.e., a negative group delay) to a narrowband signals is disclosed which adjusts the phases of the various frequency components of a signal in a manner opposite to that of a delay line. The invention also permits the amount of phase slope to be adjusted, electronically, without the need for electro-mechanical apparatus or the interchange of cables. Furthermore, embodiments of the present invention are advantageous in that at the center of the operating band they maintain the phase of the delayed signal. These results are obtained in an illustrative embodiment of the present invention which divides the signal to be delayed into two signals which traverse different signal paths and are recombined in a signal combiner. The first signal path advantageously comprises a gain control block. The second signal path advantageously comprises a second gain control block and a fixed line delay which is not found in the first signal path. The amount of phase slope imparted to the signal can be adjusted by varying the gain (or attenuation) of the respective gain control blocks.

5 Claims, 4 Drawing Sheets

METHOD AND APPARATUS FOR IMPARTING POSITIVE PHASE SLOPE TO A NARROWBAND SIGNAL

FIELD OF THE INVENTION

The present invention relates to electric circuit design in general, and more particularly, to methods and apparatus which expedite a narrowband signal.

BACKGROUND OF THE INVENTION

In electronic circuits it is often advantageous to temporally delay a narrowband electric signal. Such a delay can be realized by increasing the physical path traversed by the signal, thereby altering the phases of the various frequency components in an amount proportional to their frequency. In some applications, however, it is advantageous to expedite a narrowband signal (i.e., make the signal appear to have propagated a shorter distance than it actually did).

SUMMARY OF THE INVENTION

The present invention provides a mechanism for expediting a narrowband signal by imparting a positive phase slope to the signal, in contrast to a delay element which imparts a negative phase slope to a signal. Furthermore, embodiments of the present invention are capable of expediting the signal by an adjustable length of time while avoiding the need for mechanical apparatus or the interchange of cables. Embodiments of the present invention are particularly advantageous when processing high-frequency signals because the embodiments do not necessitate a polarity inverter.

These results are obtained in an illustrative embodiment of the present invention which divides an input signal to be delayed into two signals, each of which traverse different signal paths and are recombined in a signal combiner. The first signal path advantageously comprises a gain control block. The second signal path advantageously comprises a second gain control block and a fixed delay element which is not found in the first signal path. Where the input signal comprises a sinusoidal component at a frequency, $\omega_0$ radians per second, it is preferred that the fixed delay element be fabricated so that the second signal path is substantially close to $$\frac{\pi N}{\omega_0}$$

seconds longer than the first signal path, where N is a positive odd integer. The length of time by which the input signal is expedited can be adjusted by varying N and the gain of the respective gain control blocks.

DETAILED DESCRIPTION

Two embodiments of the present invention are described below. The first has a fixed phase slope and the second has an electronically adjustable phase slope.

I. An Embodiment with a Fixed Phase Slope

Figure 1:
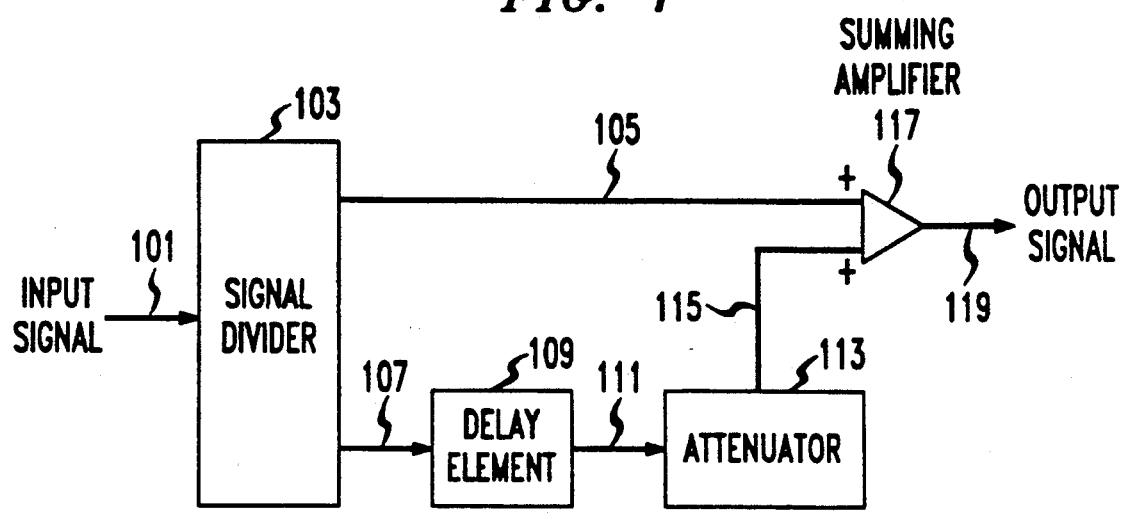
FIG. 1 shows a block diagram of an illustrative embodiment of the present invention.

FIG. 1 depicts a block diagram of an illustrative embodiment of the present invention which receives a narrowband input signal and imparts to it a positive phase slope. In the illustrative embodiment of FIG. 1 the negative group delay, d, is fixed according to criteria described below. The illustrative embodiment advantageously comprises signal divider 103, delay element 109, attenuator 113 and summing amplifier 117.

Figure 2:
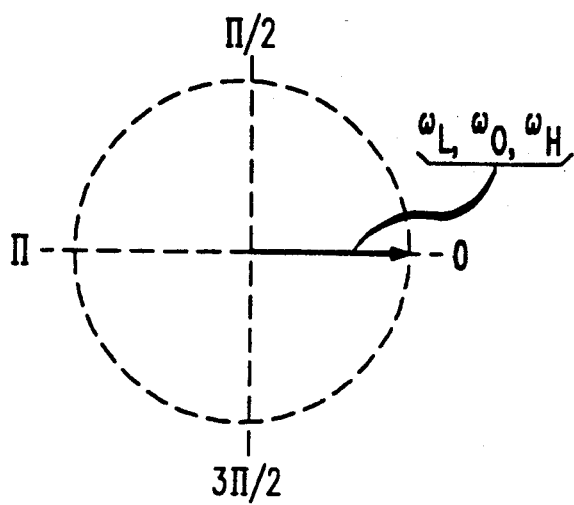
FIG. 2 depicts, using vectors, the phase relationship of three illustrative sinusoidal components of a narrowband signal at the input to the illustrative embodiment in FIG. 1.

Signal divider 103 advantageously receives on lead 101 a narrowband input signal having an root-mean-squared amplitude (hereinafter "amplitude") of magnitude one and phase defined as zero radians. FIG. 2 depicts, using vectors, the phase and amplitude of three illustrative sinusoidal components of the signal on lead 101. Signal divider 103 creates a first signal on lead 105 and a second signal on lead 107 based on the amplitude of the input signal such that both the first signal and the second signal are analog representations of the input signal. While it is preferred that the first signal and the second signal be given an equal amplitude by signal divider 103, it will be clear to those skilled in the art how to make and use embodiments of the present invention in which the first signal and second signal are not created with equal amplitudes. Furthermore, it will be clear to those skilled in the art that attenuator 113 can be subsumed by a signal divider which can adjust the proportionate amplitude of the first signal and second signal.

It is preferred that signal divider 103 create the first signal and the second signal at equal phase (i.e., 0°) although it will be clear to those skilled in the art how to make and use embodiments of the present invention which do not (e.g., using 90° hybrid 3 dB couplers). It will be clear to those skilled in the art that signal divider 103 may be fabricated in many ways using commercially available components (e.g., a resistive power divider, a Wilkinson power divider, a hybrid coupler, etc.). See E. J. Wilkinson, "An N Way Hybrid Power Divider," *IRE Trans.*, MTT-8, 116–118 (January 1960); and J. Lange, "Integrated Stripline Quadrature Hybrid," MTT-17, No. 12, 7150–7151 (December 1969). In the illustrative embodiment depicted in FIG. 1, signal divider 103 divides the input signal on lead 101 into a first signal on lead 105 and a second signal on lead 107—both of which are equal in amplitude and equal in phase.

Delay element 109 is advantageously a length of conducting material (e.g., coaxial cable, a section of strip line, a microstrip, etc., or a lumped delay line) which causes the signal path of the second signal to be longer than the signal path taken by the first signal. Where the input signal comprises a sinusoidal component at a frequency, $\omega_0$ radians per second, it is preferred that delay element 109 be fabricated so that the second signal path is substantially close to $$\frac{\pi N}{\omega_0}$$

seconds longer that the first signal path, where N is a positive odd integer, preferably one. It should be noted that delay element 103 imparts a phase shift of nominally —pi radians to the second signal at the frequency $\omega_0$. In addition, delay element 103 imparts a negative phase slope of $$\frac{\pi N}{\omega_0}$$

radians per radians per second to the other frequency components such that the higher frequency components experience a greater phase shift.

In the illustrative embodiment depicted in FIG. 1 delay element 109 receives the second signal from lead 107 and outputs the delayed second signal on lead 111. It will be clear to those skilled in the art that embodiments where attenuator 113 comes before delay element 109 in the second signal path is an equivalent circuit.

Figure 3:
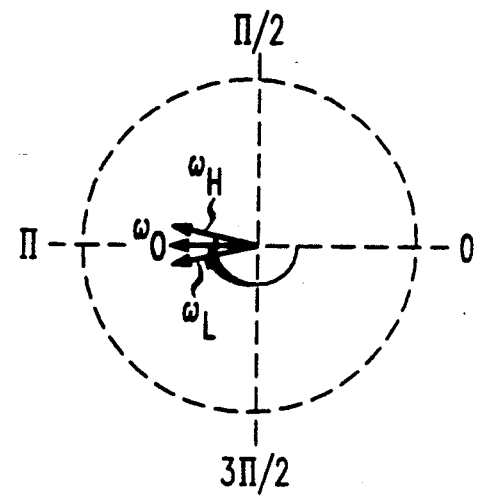
FIG. 3 depicts, using vectors, the phase relationship of the three sinusoidal components of FIG. 2 as they appear on lead 115 in FIG. 1.

Attenuator 113 is preferably a passive device which receives the second signal from lead 111 and attenuates the signal without affecting the phase of the signal. It will be clear to those skilled in the art that attenuator 113 can be fabricated in many ways using commercially available components. The "gain" associated with attenuator 113 is denoted $G_1$ and is defined to be fixed within the range $0 \leq G_1 \leq 1$. When $G_1$ equals 0.5, FIG. 3 depicts, using vectors, the three sinusoidal components associated with the second signal on lead 115.

Figure 4:
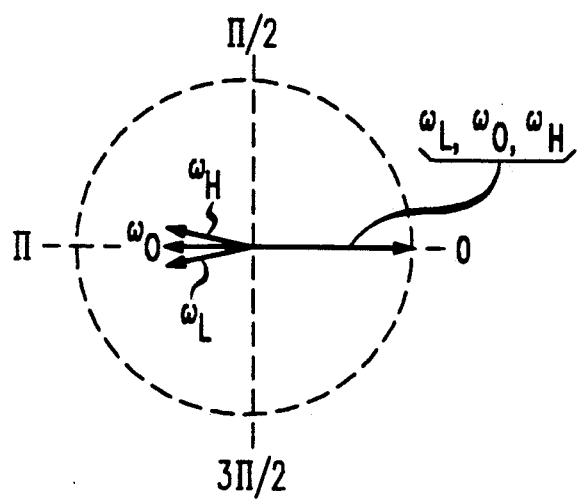
FIG. 4 depicts, using vectors, superpositioning of the phase relationship of the three sinusoidal components of FIG. 2 as they appear on leads 105 and 115 in FIG. 1.
Figure 5:
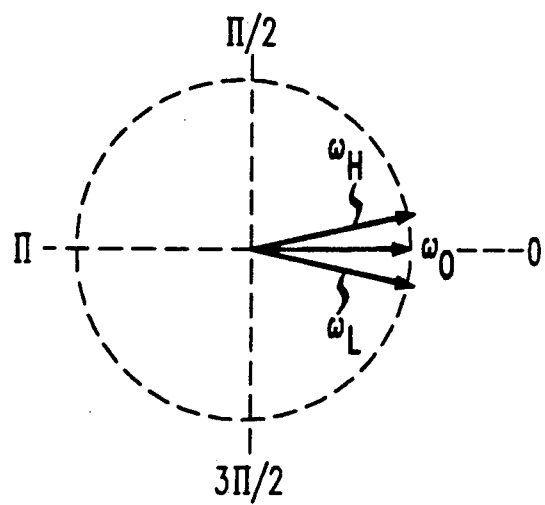
FIG. 5 depicts, using vectors, the phase relationship of the same three sinusoidal components of FIG. 2 as they appear on lead 119 in FIG. 1.

Summing amplifier 117 advantageously receives the first signal from lead 105 and the second signal from lead 115 and forms an output signal on lead 119 which is based on the unweighted sum of the amplitudes of the first signal and the second signal. While it is preferred that summing amplifier 117 combine the amplitude of the respective signals equally, it will be clear to those skilled in the art how to make and use embodiments of the present invention in which the amplitude associated with one of the signals is disproportionately added and attenuator 113 is omitted. FIG. 4 depicts, using vectors, the three sinusoidal components of the first signal on lead 105 and the three sinusoidal components of the second signal on lead 115 to be added by summing amplifier 117. Three illustrative sinusoidal components of the output signal on lead 119 are shown in FIG. 5. Note that the magnitude of components $\omega_H$ and $\omega_L$ are greater than that of $\omega_0$.

It is preferred that summing amplifier 117 combine the amplitude to the first signal and the second signal at equal phase (i.e., 0°) although it will be clear to those skilled in the art how to make and use embodiments of the present invention which do not. It will be clear to those skilled in the art that summing amplifier 117 can be fabricated in many ways using commercially available components (e.g., a Wilkinson power divider, a hybrid coupler, etc.).

When the input signal is a narrowband signal, the group delay, d, through the illustrative embodiment is equal to:

$$d = \frac{-d\alpha_{out}}{d\omega} = \frac{-G_1}{1 - G_1} \frac{2\pi N}{\omega_0} \text{ seconds.}$$

The negative polarity of the value of d indicates that the signal is expedited rather than delayed. It will be clear to those skilled in the art how to make and use embodiments of the invention for other values of $G_1$.

II. An Embodiment with an Adjustable Phase Slope

Figure 7:
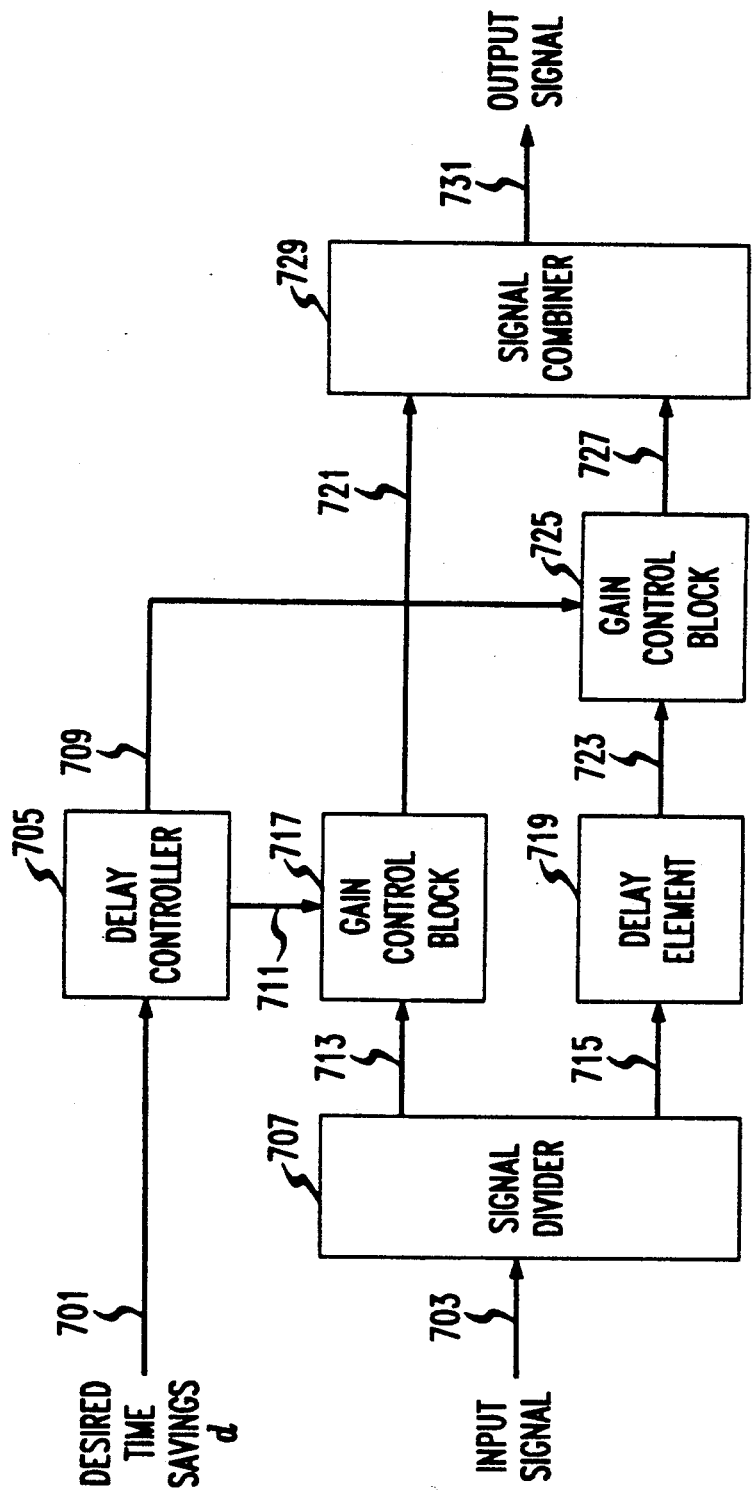
FIG. 7 shows a block diagram of an illustrative embodiment of the present invention which can adjust the amount of time by which the input signal is expedited.

FIG. 7 depicts a block diagram of an illustrative embodiment of the present invention which receives a narrowband input signal and imparts to it a positive phase slope, thereby appearing to temporally expedite the signal. The illustrative embodiment is particularly advantageous when processing high-frequency signals because it does not use a polarity inverter. Furthermore, the illustrative embodiment is characterized by a frequency response curve with upward-facing cusps.

FIG. 7 depicts a block diagram of an illustrative embodiment of the present invention in which the apparent time saved, $d_0$, advantageously can be adjusted at will, electronically, and without physically changing the length of the signal path which the input signal traverses. The illustrative embodiment advantageously comprises signal divider 707, gain control block 717, delay element 719, gain control block 725, signal combiner 729 and delay controller 705.

Signal divider 707 advantageously receives on lead 703 a narrowband input signal having an root-mean-squared amplitude (hereinafter "amplitude") and phase defined as zero radians. Signal divider 707 creates a first signal on lead 713 and a second signal on lead 715 based on the amplitude of the input signal such that both the first signal and the second signal are analog representations of the input signal. While it is preferred that the first signal and the second signal be given an equal amplitude by signal divider 707, it will be clear to those skilled in the art how to make and use embodiments of the present invention in which the first signal and second signal are not created with equal amplitudes. Furthermore, it will be clear to those skilled in the art that either or both of gain control block 717 and gain control block 725 can subsumed by a signal divider which can adjust the proportionate amplitude of the first signal and second signal.

It is preferred that signal divider 707 create the first signal and the second signal at equal phase (i.e., 0°) although it will be clear to those skilled in the art how to make and use embodiments of the present invention which do not (e.g., using 90° hybrid 3 dB couplers). It will be clear to those skilled in the art that signal divider 707 may be fabricated in many ways using commercially available components (e.g., a Wilkinson power divider, a hybrid coupler, etc.). See E. J. Wilkinson, "An N Way Hybrid Power Divider," *IRE Trans.*, MTT-8, 116–118 (January 1960); and J. Lange, "Integrated Stripline Quadrature Hybrid," MTT-17, No. 12, 7150–7151 (December 1969). In the illustrative embodiment depicted in FIG. 7, signal divider 707 divides the input signal on lead 703 into a first signal on lead 713 and a second signal on lead 715—both of which are equal in amplitude and equal in phase.

Gain control block 717 and gain control block 725 are preferably identical and are non-reflective (i.e., matched impedance on both ports on all settings) and advantageously amplify (i.e., positive gain), attenuate (i.e., negative gain) or pass through (i.e., zero gain) a signal placed on their respective input. It is preferred that the phase response of gain control block 717 and gain control block 725 be equal although it will be clear to those skilled in the art how to make and use embodiments of the present invention in which they are not. It is preferred that the respective gain of each of gain control block 717 and gain control block 725 be continuously variable in response to a gain control signal. It will be clear to those skilled in the art that each of gain control block 717 and gain control block 725 can be fabricated in many ways using commercially available components (e.g., a voltage controlled amplifier, a voltage controlled attenuator, a current controlled amplifier, a current controlled attenuator, etc.). See R. Waugh, "A Low Cost Surface Mount PIN Diode Attenuator," *Microwave journal*, 280–284 (May 1992).

In the illustrative embodiment depicted in FIG. 7, gain control block 717 comprises a voltage controlled attenuator which receives the first signal on lead 713 and outputs the first signal on lead 721 in response to the first gain control signal on lead 711. Analogously, gain control block 725 comprises a voltage controlled attenuator which receives the second signal on lead 723 and outputs second signal on lead 727 in response to the second gain control signal on lead 709. The "gain" associated with gain control block 717 is denoted $G_1$ and operates linearly over a range defined to be $0 \leq G_1 \leq 1$. Analogously, the "gain" associated with gain control block 725 is denoted $G_2$ and also operates linearly over a range defined to be $0 \leq G_2 \leq 1$. It is preferred that at all times $G_1 + G_2 = 1$.

It will be clear to those skilled in the art how to make and use embodiments of the present invention which exclude either gain control block 717 or gain control block 725. It will also be clear to those skilled in the art how to make and use embodiments of the present invention by moving either gain control block 717 or gain control block 725 past signal combiner 729 so that the input to the displaced gain control block is taken from lead 731.

Delay element 719 is advantageously a length of conducting material (e.g., coaxial cable, a section of strip line, a microstrip, etc., or a lumped delay line) which causes the signal path of the second signal to be longer than the signal path taken by the first signal. Where the input signal comprises a sinusoidal component at a frequency, $\omega_0$ radians per second, it is preferred that delay element 719 be fabricated so that the second signal path is substantially close to $$\frac{\pi N}{\omega_0}$$

seconds longer that the first signal path, where N is a positive odd integer.

In the illustrative embodiment depicted in FIG. 7 delay element 719 receives the second signal from lead 715 and outputs the delayed second signal on lead 723. It will be clear to those skilled in the art that embodiments where gain control block 725 comes before delay element 719 in the second signal path is an equivalent circuit.

Signal combiner 729 advantageously receives the first signal from gain control block 117 on lead 121 and the second signal from gain control block 725 on lead 127 and forms an output signal on lead 131 which is based on the unweighted sum of the amplitudes of the first signal and the second signal. While it is preferred that signal combiner 729 combine the amplitude of the respective signals equally, it will be clear to those skilled in the art how to make and use embodiments of the presents invention in which the amplitude associated with one of the signals is disproportionately added. Furthermore, it will be clear to those skilled in the art that either or both of gain control block 717 and gain control block 725 can subsumed by a signal combiner which can vary the weighting with which the first signal and the second signal are added.

It is preferred that signal combiner 729 combine the amplitude to the first signal and the second signal at opposite phase (i.e., $\pi$ radians) although it will be clear to those skilled in the art how to make and use embodiments of the present invention which do not. It will be clear to those skilled in the art that signal combiner 729 can be fabricated in many ways using commercially available components (e.g., a Wilkinson power divider, a hybrid coupler, etc.).

Figure 6:
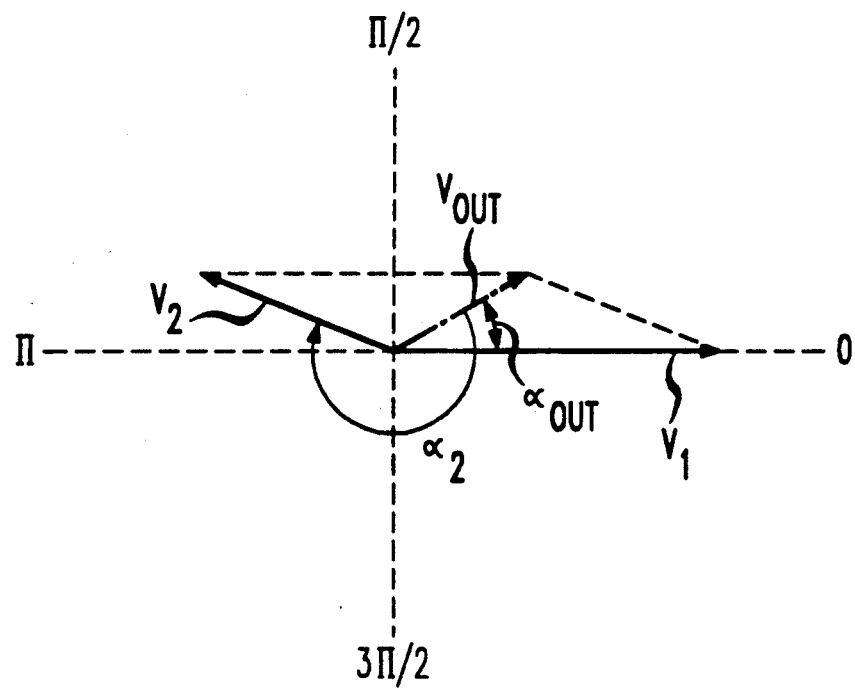
FIG. 6 depicts, using vectors, the trigonometry associated with analytically summing two vectors.

The operation of the illustrative embodiment depicted in FIG. 7 can be represented as follows. When the input signal is a narrowband signal, the group delay, d, through the illustrative embodiment is defined as:

$$d = \frac{-d\alpha_{out}}{d\omega} \quad (1)$$

where $$\frac{d\alpha_{out}}{d\omega}$$

is the first derivative of the phase of the output signal on lead 731 with respect to the frequency of the signal. Phase lag is defined as a negative number. In terms of vectors, the first signal on lead 721 is:

$$|V_1| = \frac{G_1|V_{in}|}{2} \text{ and } \alpha_1 = 0 \quad (2a, 2b)$$

where $V_{in}$ is the input signal on lead 703. The second signal on lead 727 is:

$$|V_2| = \frac{G_2|V_{in}|}{2} \text{ and } \alpha_2 = -\frac{2\pi N\omega}{\omega_0} \quad (3a, 3b)$$

where N is a positive odd integer and $$\frac{2\pi N}{\omega_0}$$

is the length of delay element 719 in seconds. Using trigonometry as shown in FIG. 6 to analytically add the vectors representing the signals, it can be seen that for a given frequency:

$$\alpha_{OUT} = \arctan\left(\frac{|V_2|\sin\alpha_2}{|V_2|\cos\alpha_2 + |V_1|}\right) \quad (4)$$

For narrowband operation, the value of $\alpha_2$ is close to $\pi$. Therefore, the approximations $\sin\alpha \approx \alpha$, $\cos\alpha \approx -1$, and $\arctan\alpha \approx \alpha$ are used. Therefore, Equation (4) becomes:

$$a_{out} = \frac{|V_2|\alpha_2}{|V_1| - |V_2|} . \quad (5)$$

Combining equations 2a, 3a, 3b and 5 yields:

$$a_{out} = \frac{G_2 \frac{|V_{in}|}{2}}{G_1 \frac{|V_{in}|}{2} - G_2 \frac{|V_{in}|}{2}} \frac{2\pi N\omega}{\omega_0} . \quad (6)$$

Simplifying equation (6) yields:

$$a_{out} = \frac{G_2}{G_1 - G_2} \frac{2\pi N\omega}{\omega_0} \quad (7)$$

Figure 8:
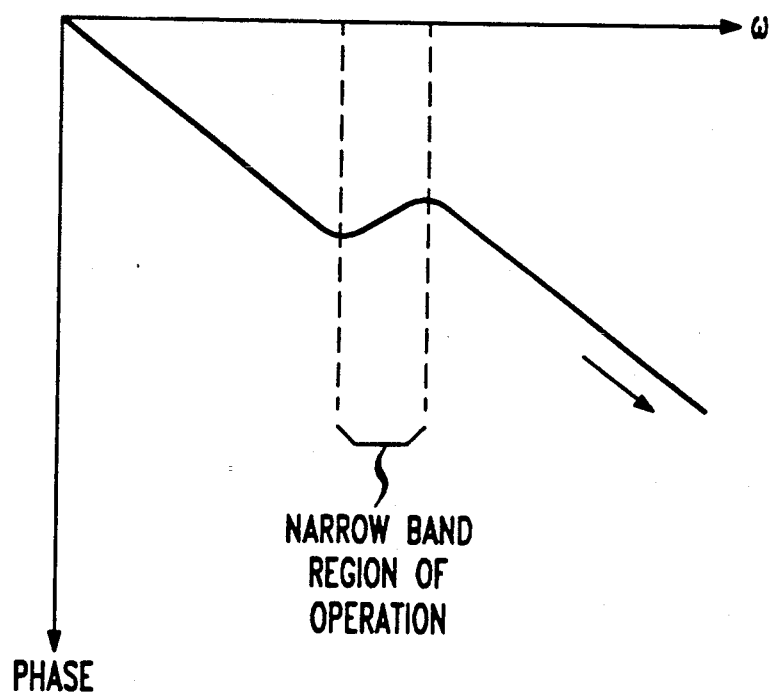
FIG. 8 depicts the phase response of the illustrative embodiment shown in FIG. 1.

Referring back to Equation (1) the delay through the illustrative embodiment is:

$$d = \frac{-d a_{out}}{d\omega} = \frac{-G_2}{G_1 - G_2} \frac{2\pi N}{\omega_0} \quad (8)$$

which is a function of the relative gain of the gain control block 717 and gain control block 725. It will be clear to those skilled in the art how to make and use embodiments of the invention using appropriate values as shown in Equation (8). FIG. 8 depicts a typical phase response curve associated the illustrative embodiment of the present invention depicted in FIG. 7.

I claim:

1. An apparatus for processing an input signal comprising an input amplitude and a sinusoidal component at $\omega_0$ radians per second, said apparatus comprising:
    a signal divider for creating a first signal, comprising a first amplitude, based on said input signal and for inputting said first signal onto a first signal path, and for creating a second signal, comprising a second amplitude, based on said input signal and for inputting said second signal onto a second signal path, wherein said first signal and said second signal are each analog representations of said input signal;
    a signal combiner for receiving said first signal from said first signal path, and for receiving said second signal from said second signal path, and for creating an output signal, comprising an output amplitude, based on the sum of said first signal and said second signal;
    a delay element in said second signal path for making said second signal path substantially close to $$\frac{\pi N}{\omega_0}$$

seconds longer than said first signal path, where N is a positive odd integer; and
    attenuator means in said second signal path for attenuating said second signal relative to said first signal.

2. The apparatus of claim 1 wherein said output amplitude is substantially equal to said input amplitude.

3. The apparatus of claim 1 wherein said signal divider comprises a hybrid coupler.

4. An apparatus for processing an input signal comprising an input amplitude and a sinusoidal component at $\omega_0$ radians per second, said apparatus comprising:
    a signal divider for creating a first signal, comprising a first amplitude, based on said input signal and for inputting said first signal onto a first signal path, and for creating a second signal, comprising a second amplitude, based on said input signal and for inputting said second signal onto a second signal path, wherein said first signal and said second signal are each analog representations of said input signal;
    a signal combiner for receiving said first signal from said first signal path, and for receiving said second signal from said second signal path, and for creating an output signal, comprising an output amplitude, based on the sum of said first signal and said second signal;
    a first gain control block in said first signal path for modifying said amplitude of said first signal;
    a delay element in said second signal path for making said second signal path substantially close to $$\frac{\pi N}{\omega_0}$$

seconds longer than said first signal path, where N is a positive odd integer; and
    a second gain control block in said second signal path for modifying said second amplitude of second signal.

5. The apparatus of claim 4 wherein said signal divider comprises a hybrid coupler, said first gain control block comprises a voltage controlled attenuator, and said second gain control block comprises a voltage controlled attenuator.

* * * * *